(12) United States Patent
Krauth

(10) Patent No.: US 6,207,357 B1
(45) Date of Patent: Mar. 27, 2001

(54) METHODS OF FORMING PHOTORESIST AND APPARATUS FOR FORMING PHOTORESIST

(75) Inventor: Anthony C. Krauth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/299,221

(22) Filed: Apr. 23, 1999

(51) Int. Cl.[7] .................................................. G03C 5/00
(52) U.S. Cl. ............................................ 430/327; 430/330
(58) Field of Search ...................................... 430/327, 330

(56) References Cited

U.S. PATENT DOCUMENTS 5,405,813 * 4/1995 Rodrigues ............................. 437/231
5,677,001 * 10/1997 Wang et al. ........................... 427/240

FOREIGN PATENT DOCUMENTS 1-265516 * 10/1989 (JP) .
4-196518 * 7/1992 (JP) .

* cited by examiner

*Primary Examiner*—Shean C. Wu
(74) *Attorney, Agent, or Firm*—Wells, St. John, Roberts, Gregory & Matkin P.S.

(57) ABSTRACT

Methods of forming layers of photoresist and apparatus for forming photoresist are described. In one embodiment, a wafer is provided and photoresist is applied thereover. The wafer is rotated while the photoresist is baked. In another embodiment, a wafer having photoresist formed thereover is positioned at a baking station. After positioning, the wafer is moved while exposed to baking conditions at the station. In another embodiment, a wafer having photoresist applied thereover is positioned on a rotatable hot plate at a photoresist baking station. The rotatable hot plate is rotated during at least some of the time the wafer is baked at the station. In another embodiment, photoresist is applied over a wafer surface and into a predefined non-uniform thickness over the surface. The non-uniform thickness is modified over the surface into a more uniform thickness while the photoresist is baked.

9 Claims, 3 Drawing Sheets

METHODS OF FORMING PHOTORESIST AND APPARATUS FOR FORMING PHOTORESIST

TECHNICAL FIELD

This invention relates to methods of forming photoresist and to apparatus for forming photoresist.

BACKGROUND OF THE INVENTION

When semiconductor wafers are processed, they typically undergo a number of photolithographic processes in which photoresist is applied, exposed and developed over the wafer. Photoresist is utilized to define patterns of circuit features which can then be etched or diffused into the substrate or various layers formed thereover. It is highly desirable to provide a photoresist layer which is uniform in its thickness across the wafer.

A typical photolithographic process can involve the following steps. A wafer is typically pretreated in order to obtain smooth, uniform coverage of the photoresist with good adhesion of the resist to the wafer. Such pretreatment can involve a dehydration bake which is intended to drive off most of the water on the surface of the wafer. The wafer can then be treated with a chemical primer to promote adhesion of the photoresist. After priming, the wafer can be coated with photoresist. Most commonly, photoresist is applied by spin-coating it onto the wafer. After spin-coating, the wafers typically undergo baking which drives off solvent in the photoresist. After the baking, the wafer can be exposed and developed.

Situations can arise during photolithographic processing, and in particular with the after-coating baking, which can cause the resultant photoresist to have a characteristic slope in its thickness across the wafer. One cause of this characteristic slope is due to air flow inside, or around various apparatus which are used to bake the photoresist. Specifically, air flow inside or around these apparatus can cause one side of a wafer to bake or cool differently than another side of the wafer. This variability can cause the characteristic slope in the resist thickness. Additionally, some processing can involve inserting coated wafers into a processing chamber containing a hot plate for heating wafers. The wafers are typically inserted from one end of the chamber. Conditions within the chamber can cause the side of the wafer closest to the chamber end from which it was inserted to be cooler than other portions of the wafer disposed further within the chamber. Such can lead to thickness uniformity problems, such as producing a thicker resist layer towards the insert end of the chamber versus the fixed end wall portion of the chamber. Hence, due to temperature irregularities and other effects, a thickness gradient can occur resulting in thicker photoresist on one side of the wafer at the conclusion of heat processing within the chamber.

Accordingly, this invention arose out of concerns associated with providing improved methods and apparatus for forming uniformly-thick photoresist layers.

SUMMARY OF THE INVENTION

Methods of forming layers of photoresist and apparatus for forming photoresist are described. In one embodiment, a wafer is provided and photoresist is applied thereover. The wafer is rotated while the photoresist is baked. In another embodiment, a wafer having photoresist formed thereover is positioned at a baking station. After positioning, the wafer is moved while exposed to baking conditions at the station. In another embodiment, a wafer having photoresist applied thereover is positioned on a rotatable hot plate at a photoresist baking station. The rotatable hot plate is rotated during at least some of the time the wafer is baked at the station. In another embodiment, photoresist is applied over a wafer surface and into a predefined non-uniform thickness over the surface. The non-uniform thickness is modified over the surface into a more uniform thickness while the photoresist is baked.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
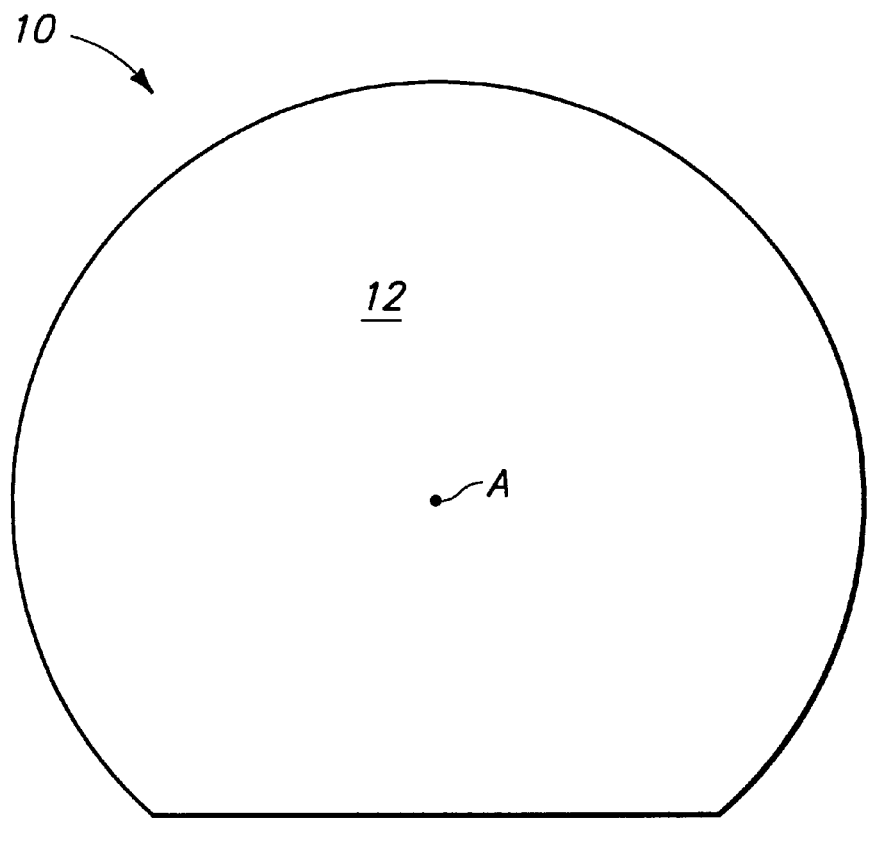
FIG. 1 is a top plan view of a semiconductor wafer.
Figure 2:
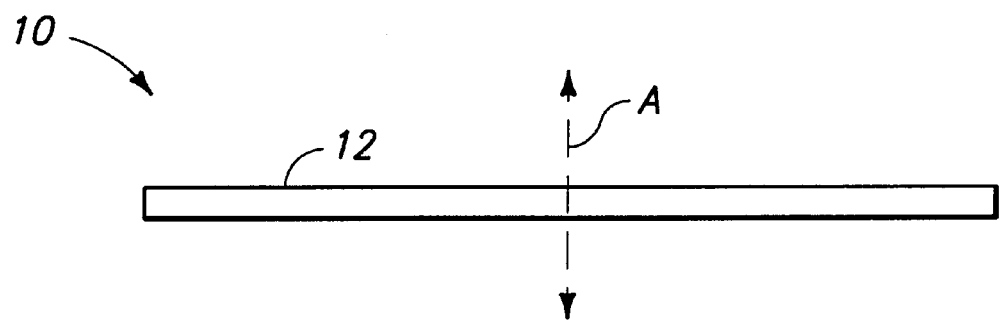
FIG. 2 is a side elevational view of the FIG. 1 wafer.

Referring to FIGS. 1 and 2, a semiconductor wafer is shown generally at 10 and includes a wafer surface 12. Wafer 10 has a central axis A which is disposed generally orthogonally relative to wafer 10.

Figure 3:
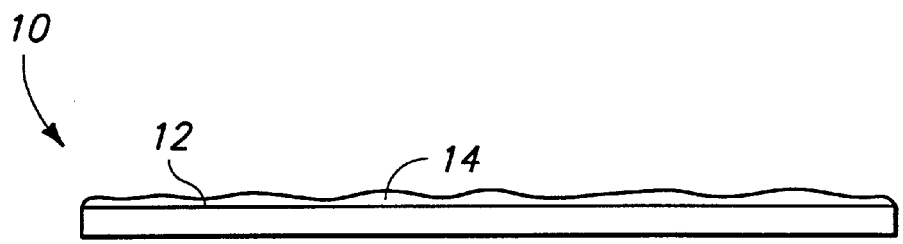
FIG. 3 is a view of the FIG. 2 wafer at a processing step in accordance with one embodiment of the invention.

Referring to FIG. 3, a photoresist layer 14 is formed or applied over wafer 10. Dimensions which are shown in the figures are not shown to scale, but rather are somewhat exaggerated for illustrative purposes. Any suitable method can be used to apply or form photoresist over the wafer. The most common application method, however, is spin-coating. Typically, spin coating involves mounting the wafer on a vacuum chuck, which is a flat, hollow metal disc connected to a vacuum line. The chuck has a number of small holes in a surface which is disposed adjacent the wafer. When a wafer is placed on the surface, the vacuum draws the wafer into intimate contact with the chuck. A predetermined amount of resist is then dispensed on the surface of the wafer. Torque is applied to the chuck to rapidly accelerate it at a controlled rate up to a maximum rotational speed, usually between 2,000 to 5,000 RPMs. The wafer is spun at a predetermined speed for a fixed period of time, then decelerated in a controlled manner to a stop. A variation of this method, called a dynamic dispense, is to apply some or all of the resist while the wafer is spinning at a low speed. This allows the resist to spread across the wafer before the high speed spin. Preferred photoresists utilized in accordance with the invention are thinner rather than thicker materials. More specifically, the preferred photoresists have viscosity as initially applied of no greater than about 20 cP if measured at room temperature, and even more preferably no greater than about 10 cP if measured at room temperature. DUV resists are example thinner resists typically having the lower viscosity.

In one embodiment, photoresist layer 14 is provided over the wafer into an uneven thickness over the wafer for purposes which will become evident below.

Figure 4:
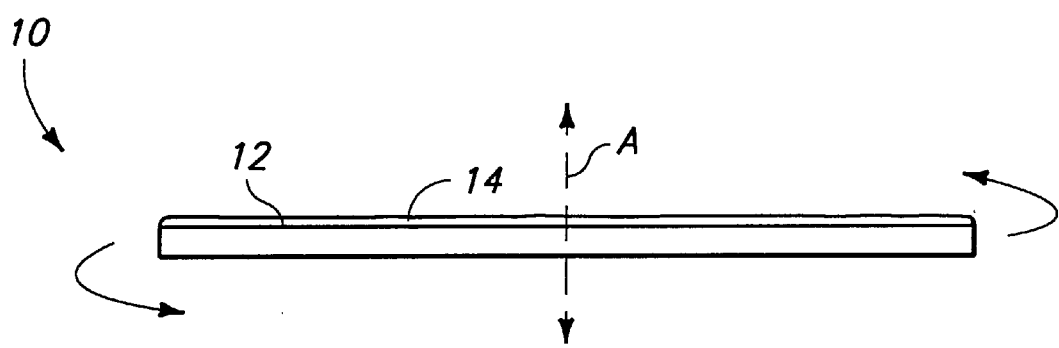
FIG. 4 is a view of the FIG. 3 wafer at a processing step which is subsequent to that which is shown in FIG. 3.

Referring to FIG. 4, and in accordance with one embodiment of the invention, wafer 10 is moved while the photoresist is baked. Movement can occur during some or all of the baking of the wafer. Typically, baking is used to drive off most of the solvent which is present in the resist and to establish the exposure characteristics of the photoresist. For example, the dissolution rate in the developer will be highly dependent on the solvent concentration in the final photoresist. In one preferred embodiment, movement of the wafer is accomplished by rotating the wafer during the photoresist bake, most preferably about its central axis A during at least some of the baking of the photoresist. Preferred rate of rotation is less than about 100 rpm, with from about 20 rpm to about 30 rpm being more preferred. Rotation is also preferably maintained constant throughout baking. Too low a speed can result in an uneven baking process around the edge due to lowering of solvent concentration over time. A specific example using a DUV resist would be a bake at 90° C. to 90 seconds while rotating the wafer at 30 rpm throughout the baking. Alternately but less preferred, halting of rotation could occur at some point in the process and baking then continued.

By moving the wafer, preferably through rotation, during at least some of the time the wafer is baked, the photoresist is provided into a more even thickness over the wafer. Thus, in one embodiment the photoresist is initially applied over the wafer into an uneven thickness and then through the preferred rotation during baking, provided into a more even thickness over the wafer. This aspect of the invention can increase or enhance the uniformity of the thickness of the photoresist which is ultimately formed over the wafer.

Figure 5:
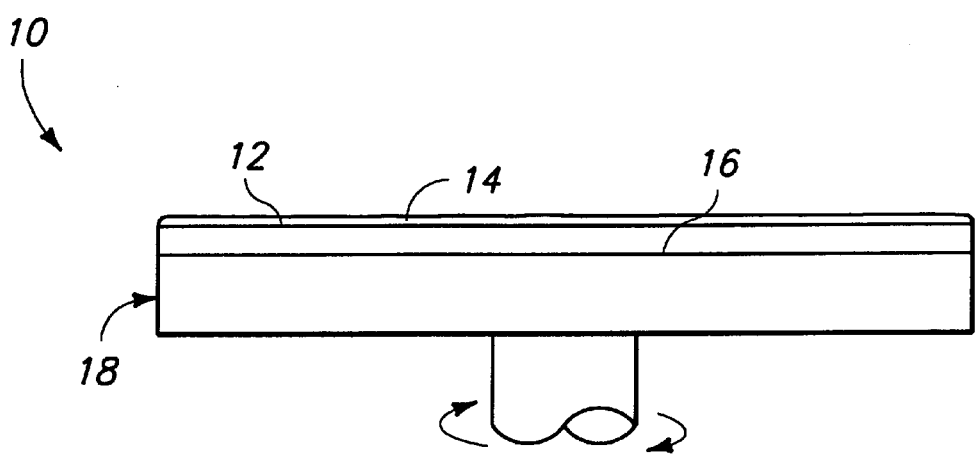
FIG. 5 is a view of the FIG. 3 wafer at a processing step in accordance with another embodiment of the invention.

Referring to FIG. 5, and in accordance with one embodiment of the invention, a rotatable surface 16 is provided. Rotation of wafer 10 during baking comprises placing wafer 10 onto rotatable surface 16, and then rotating the rotatable surface during at least some of the baking of the photoresist. In one preferred embodiment, rotatable surface 16 comprises a hot plate 18. Accordingly, rotation of the wafer during baking comprises placing the wafer onto the rotatable hot plate 18, and rotating the hot plate during at least some of the baking.

Figure 6:
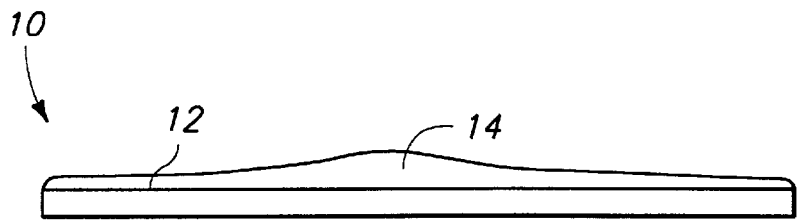
FIG. 6 is a view of a semiconductor wafer undergoing processing in accordance with one embodiment of the invention.

Referring to FIG. 6, and in accordance with another embodiment of the invention, application of photoresist layer 14 comprises providing more photoresist towards the center of wafer 10 than towards the periphery of the wafer. Such results in the illustrated uneven thickness of the photoresist over the surface of wafer 10. A preferred difference in thickness is no greater than about 1.0% thicker at the center, with a range of from about 0.6% to about 0.8% thicker being preferred. A specific example would be to deposit from about 6540 Angstroms to about 6550 Angstroms at the center and about 6500 Angstroms at the periphery.

Subsequently, the preferred rotation during baking comprises doing so with the photoresist as applied in FIG. 6. Rotation of the wafer during baking causes (in evenly-coated wafers) symmetrical poor uniformity in the thickness of the photoresist to occur at the center of the wafer, with thicker photoresist portions being formed at the periphery of the wafer. However, because the wafer is coated as shown in FIG. 6 with an initial thicker portion of photoresist towards the center of the wafer, such will subsequently be cured into a more uniform layer during baking.

Figure 7:
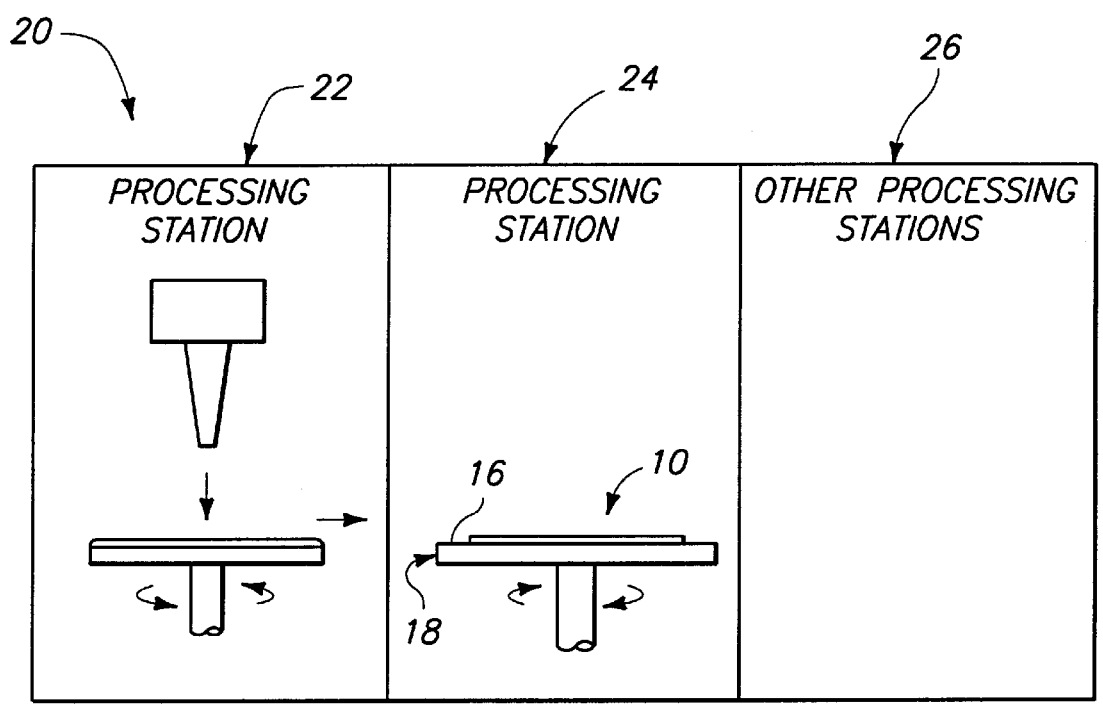
FIG. 7 is a schematic view of a wafer processing system in accordance with one embodiment of the invention.

Referring to FIG. 7, and in accordance with one embodiment of the invention, a wafer processing system is provided and generally shown at 20. Wafer processing system 20 can have only one processing station such as station 24 described below. Alternately, wafer processing system 20, in a preferred embodiment, is provided in the form of a track having at least two, and likely more processing stations 22, 24, and 26. One of the processing stations, i.e. processing station 22, provides a location where photoresist can be applied to a semiconductor wafer. Another of the processing stations, i.e. processing station 24, provides a location where the semiconductor wafer can be baked in accordance with one or more embodiments of the invention as described above. Further processing stations, i.e. processing stations represented at 26, can be provided for performing a variety of other functions which are generally known.

In one embodiment, wafer 10 is positioned at a baking station such as processing station 24. After the wafer is positioned, the wafer is moved while exposing the wafer to baking conditions at the baking station. Movement can occur during some or all of the baking of the wafer. In a preferred embodiment, movement of the wafer comprises rotating the wafer as described above in connection with FIGS. 4 and 5. In another embodiment, photoresist is first applied at a station such as processing station 22, with the wafer being subsequently moved to another processing station, e.g. processing station 24, for baking. Baking can then take place as described above and below.

Referring still to FIG. 7, and in accordance with one embodiment of the invention, surface 16 comprises a movable surface which is moved during at least some of the time the photoresist is baked. In another embodiment, surface 16 is part of a hot plate 18 which is movable during at least some of the baking. In one preferred embodiment, surface 16 comprises a rotatable surface which is rotated during at least some of the baking of the photoresist. In another preferred embodiment, hot plate 18 comprises a rotatable hot plate which is rotated during at least some of the baking. In the illustrated example of FIG. 7, photoresist is applied to a wafer at one location, i.e. processing station 22, and the wafer is positioned at another location, i.e. processing station 24, for baking.

Figure 8:
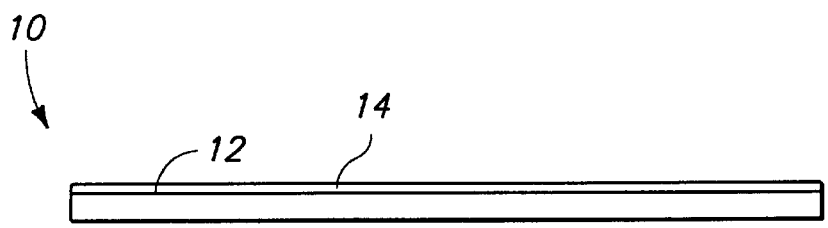
FIG. 8 is a view of a semiconductor wafer having been processed in accordance with one or more embodiments of the present invention.

Referring to FIG. 8, wafer 10 is shown as having been processed in accordance with one or more of the above-described embodiments. There, it will be appreciated, that the photoresist as previously initially formed over the wafer, and subsequently processed as described above, has been provided into a substantially even thickness over the wafer.

Various embodiments of the invention provide for photoresist to be applied over a wafer surface 12 and into a predefined, non-uniform thickness over the surface. An exemplary predefined, non-uniform thickness is illustrated in connection with FIG. 6. Such is not, however, intended to be limiting in any sense. The non-uniform thickness over the surface is then modified into a more uniform thickness over the surface while the photoresist is baked. In one embodiment, the photoresist is initially applied to be elevationally thicker towards the center of the wafer surface, such as is shown in FIG. 6. In another embodiment, an exemplary one of which being shown in FIG. 7, the photoresist is initially spin-coated onto the wafer to be elevationally thicker towards the center of the wafer surface. Modification of the non-uniform photoresist layer thickness preferably takes place after application of the photoresist as by, for example, spin-coating the photoresist, and in a discrete processing step.

An exemplary processing station at which such discrete processing step takes place is shown in FIG. 7 at 24. In one embodiment, modification of the non-uniform thickness comprises moving the wafer surface while baking the photoresist. Movement can occur during some or all of the baking of the wafer. In another embodiment, modification of the non-uniform thickness comprises rotating the wafer surface about a defined axis. In a preferred embodiment, such defined axis comprises a central axis of the wafer, such as axis A in FIGS. 1 and 2. In another embodiment, modification of the non-uniform thickness comprises placing the wafer surface on a moveable surface and moving the moveable surface during at least some of the baking. In another embodiment, modification of the non-uniform thickness comprises placing the wafer surface on a hot plate and rotating the hot plate during at least some of the baking.

Advantages of the above-described embodiments can include compensation for temperature fluctuations, changes, or variations which, heretofore resulted in non-uniform photoresist thickness over a wafer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a layer of photoresist over a substrate comprising:
   providing a wafer;
   applying photoresist over the wafer;
   rotating the wafer while baking the photoresist; and
   wherein the applying of the photoresist comprises providing more photoresist towards the center of the wafer than towards the periphery of the wafer, and wherein said rotating comprises doing so with said photoresist as applied.

2. The method of claim 1 wherein the photoresist at the center of the wafer is from 0.6% to 0.8% thicker than at the periphery of the wafer.

3. The method of claim 1 comprising halting the rotating during the baking and continuing baking of the photoresist while the rotating is halted.

4. A method of forming a layer of photoresist over a substrate comprising:
   providing a wafer;
   applying photoresist over the wafer;
   rotating the wafer while baking the photoresist; and
   halting the rotating during the baking and then continuing baking of the photoresist while the rotating is halted.

5. A method of forming a layer of photoresist over a substrate comprising:
   providing a semiconductor wafer;
   applying photoresist over the semiconductor wafer;
   positioning the wafer on a rotatable hot plate at a photoresist baking station;
   rotating the rotatable hot plate during at least some of the time the wafer is baked at the baking station; and
   wherein the applying of the photoresist comprises providing more photoresist towards the center of the wafer than towards the periphery of the wafer, and wherein said rotating comprises doing so with said photoresist as applied.

6. The method of claim 5 comprising halting the rotating during the baking and continuing baking of the photoresist while the rotating is halted.

7. A method of forming a layer of photoresist over a substrate comprising:
   applying photoresist over a wafer surface and into a predefined non-uniform thickness over the surface;
   modifying the non-uniform thickness over the surface into a more uniform thickness over the surface while baking the photoresist by moving the wafer during at least some of the baking; and
   wherein the applying of the photoresist comprises initially applying said photoresist to be elevationally thicker towards the center of the wafer surface.

8. The method of claim 7 wherein the photoresist at the center of the wafer is less than about 1.0% thicker than at the periphery of the wafer.

9. The method of claim 7 comprising halting the moving during the baking and continuing baking of the photoresist while the movement is halted.

* * * * *

UNITED STATES PATENT AND TRADEMARK OFFICE
CERTIFICATE OF CORRECTION

PATENT NO. : 6,207,357 B1
DATED : March 27, 2001
INVENTOR(S) : Anthony C. Krauth Page 1 of 1

It is certified that error appears in the above-identified patent and that said Letters Patent is hereby corrected as shown below:

<u>Column 1,</u>
Line 36, replace "around various" with -- around, various --.

Signed and Sealed this

Twenty-fifth Day of September, 2001

Attest:

*Nicholas P. Godici*

NICHOLAS P. GODICI
*Attesting Officer*     *Acting Director of the United States Patent and Trademark Office*